(12) United States Patent
Shen et al.

(10) Patent No.: US 10,512,172 B2
(45) Date of Patent: Dec. 17, 2019

(54) SYSTEM FOR PRESSING PRE-TIN SHAPING

(71) Applicants: Tyco Electronics (Dongguan) Co., Ltd., Dongguan (CN); Tyco Electronics (Shanghai) Co., Ltd, Shanghai (CN); Shenzhen AMI Technology Co. Ltd, Shenzhen (CN); TE Connectivity Germany GmbH, Bensheim (DE)

(72) Inventors: Hongzhou Shen, Shanghai (CN); Dandan Zhang, Shanghai (CN); Qinglong Zeng, Shanghai (CN); Roberto Francisco-Yi Lu, Berwyn, PA (US); George Dubniczki, Shanghai (CN)

(73) Assignees: Tyco Electronics (Dongguan) Co., Ltd., Dongguan (CN); Tyco Electronics (Shanghai) Co., Ltd., Shanghai (CN); Shenzhen AMI Technology Co. Ltd., Shenzhen (CN); TE Connectivity Germany GmbH, Bensheim (DE)

( * ) Notice: Subject to any disclaimer, the term of this patent is extended or adjusted under 35 U.S.C. 154(b) by 253 days.

(21) Appl. No.: 15/335,965

(22) Filed: Oct. 27, 2016

(65) Prior Publication Data
US 2017/0118845 A1    Apr. 27, 2017

(30) Foreign Application Priority Data

Oct. 27, 2015   (CN) .......................... 2015 1 0713062

(51) Int. Cl.
*H03K 3/40*   (2006.01)
*H05K 3/40*   (2006.01)
*B23K 1/00*   (2006.01)
*B23K 1/20*   (2006.01)
*B23K 3/08*   (2006.01)
(Continued)

(52) U.S. Cl.
CPC .......... *H05K 3/403* (2013.01); *B23K 1/0016* (2013.01); *B23K 1/20* (2013.01); *B23K 3/08* (2013.01); *H05K 1/117* (2013.01); *H05K 3/101* (2013.01); *H05K 3/3405* (2013.01); *H05K 2201/09381* (2013.01); *H05K 2201/09745* (2013.01); *H05K 2201/10287* (2013.01); *H05K 2203/0165* (2013.01); *H05K 2203/0195* (2013.01); *H05K 2203/0278* (2013.01);
(Continued)

(58) Field of Classification Search
CPC ................ H01R 43/02; H01R 43/0207; H01R 43/0214; B23K 1/0016; B23K 1/20; B23K 3/08; H01K 1/117; H01K 3/101; H01K 3/3405; H01K 3/403; H05K 2201/09381; H05K 2201/09745; H05K 2201/10287; H05K 2203/0165; H05K 2203/0195; H05K 2203/0278; H05K 2203/0392; H05K 2203/1105; H05K 2203/16

See application file for complete search history.

(56) References Cited

FOREIGN PATENT DOCUMENTS

JP    56-96594    * 7/1981
JP    63-30156    * 8/1988

* cited by examiner

*Primary Examiner* — Carl J Arbes
(74) *Attorney, Agent, or Firm* — Barley Snyder

(57) ABSTRACT

A pre-tin shaping system is disclosed. The pre-tin shaping system comprises a base securely holding a circuit board having a pre-tin layer, a heat-press unit having a contact tip, and a movable unit moving the heat-press unit relative to the base. The contact tip is movable to shape the pre-tin layer.

14 Claims, 3 Drawing Sheets

(51) Int. Cl.
*H05K 3/10* (2006.01)
*H05K 1/11* (2006.01)
H05K 3/34 (2006.01)
(52) U.S. Cl.
CPC ................ *H05K 2203/0392* (2013.01); *H05K 2203/1105* (2013.01); *H05K 2203/16* (2013.01)

SYSTEM FOR PRESSING PRE-TIN SHAPING

CROSS-REFERENCE TO RELATED APPLICATION

This application claims the benefit of the filing date under 35 U.S.C. § 119(a)-(d) of Chinese Patent Application No. 201510713062.1, filed on Oct. 27, 2015.

FIELD OF THE INVENTION

The present invention relates to a circuit board, and more particularly, to a tin-plated pad of a circuit board.

BACKGROUND

Circuit boards having pre-tin layers disposed on pads of the circuit board are known in the art. The pre-tin layers are commonly formed on the pads by surface mount technology ("SMT"), and are soldered to electrical contacts of an electrical connector in order to achieve a structural and electrical connection between the circuit board and the electrical connector. Soldering joints between such pre-tin layers and contacts, however, are commonly dry or otherwise faulty, leading to a failure of the electrical connection between the circuit board and the electrical connector.

SUMMARY

An object of the invention, among others, is to provide a system and method for performing a shaping operation to pre-tin on a pad of a circuit board, reducing the risk of a faulty soldering joint. The disclosed pre-tin shaping system comprises a base securely holding a circuit board having a pre-tin layer, a heat-press unit having a contact tip, and a movable unit moving the heat-press unit relative to the base. The contact tip is movable to shape the pre-tin layer.

BRIEF DESCRIPTION OF THE DRAWINGS

The invention will now be described by way of example with reference to the accompanying figures, of which.

DETAILED DESCRIPTION OF THE EMBODIMENT(S)

Figure 1:
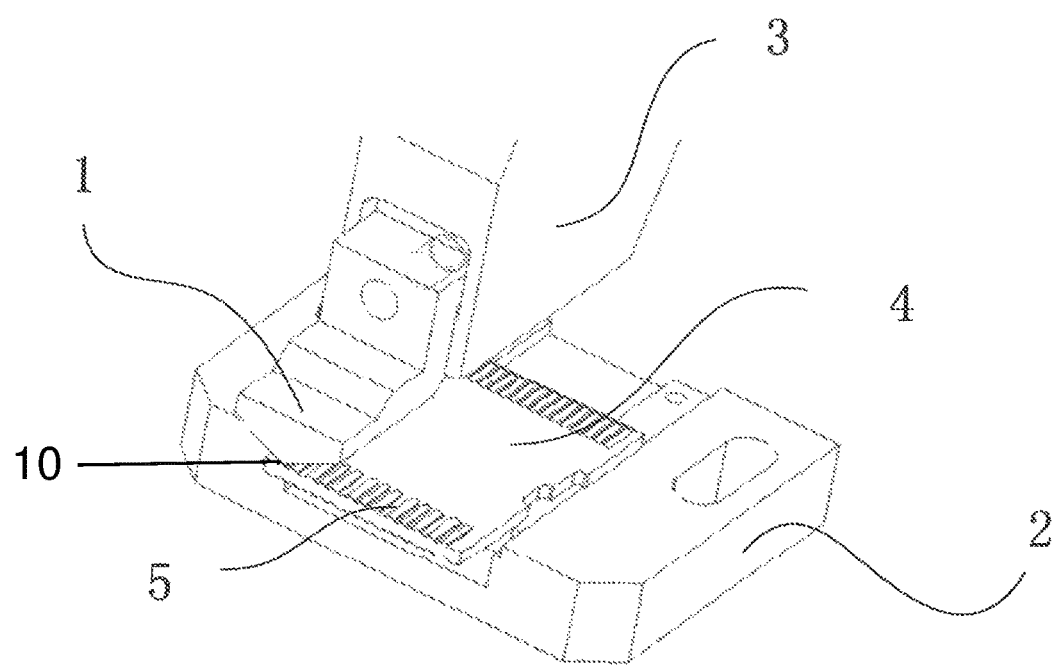
FIG. 1 is a perspective view of a pre-tin shaping system according to the invention.

The specific embodiments of the present invention will be described hereinafter in detail, and examples thereof are illustrated in the attached drawings, in which like reference numerals refer to like elements. The specific embodiments described with reference to the attached drawings are only exemplary, so as to fully convey the scope of the invention to those skilled in the art, and should not be construed as limiting the present invention.

A pre-tin shaping system according to the invention is shown generally in FIG. 1. The pre-tin shaping system includes a heat-press unit 1, a base 2, and a movable unit 3. The major components of the invention will now be described in greater detail.

Figure 4:
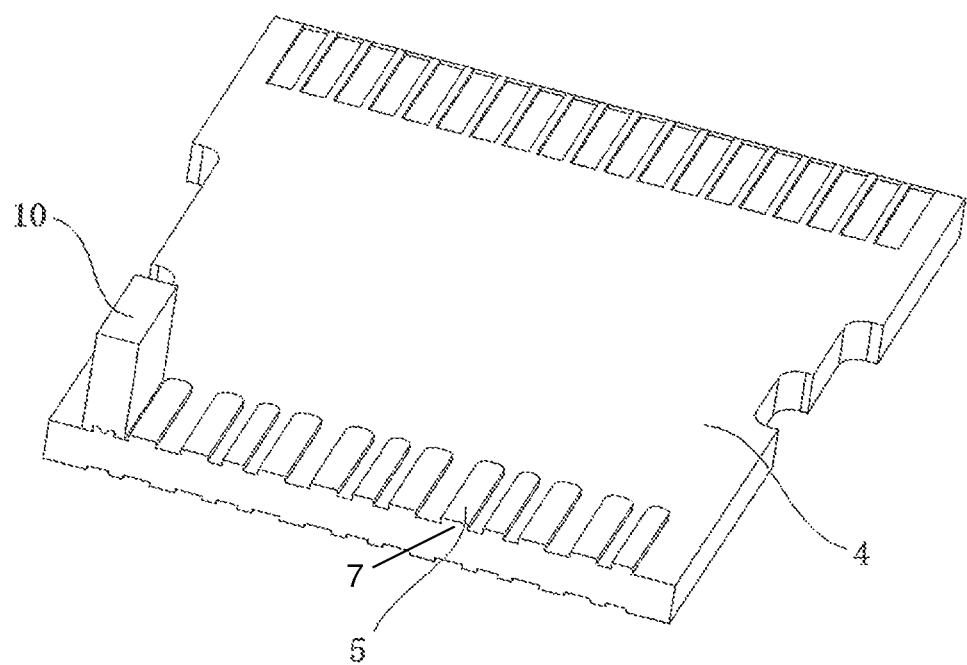
FIG. 4 is a perspective view of a contact tip of the pre-tin shaping system 1 with the circuit board.
Figure 5:
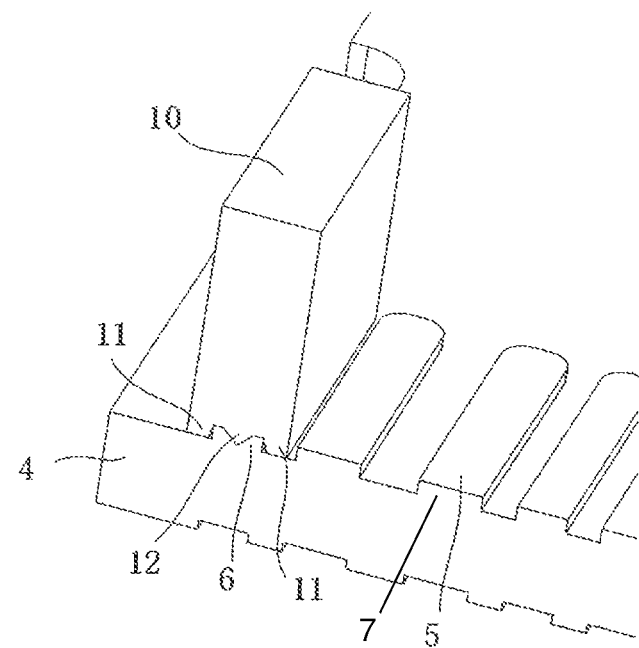
FIG. 5 is an enlarged view of a portion of FIG. 4.

The heat-press unit 1, as shown in FIGS. 1, 4, and 5, has a contact tip 10. The contact tip 10 has a first end connected to the movable unit 3 via the heat-press unit 1. As shown in FIG. 5, the contact tip 10 has a pair of supports 11 and a shaped heater 12 at an opposite second end of the contact tip 10, the shaped heater 12 is disposed between the pair of supports 11. In the shown embodiment, the shaped heater 12 has a V-shape, but as would be understood by one with ordinary skill in the art, the shaped heater 12 could alternatively have a U-shape or any other suitable shape.

The base 2, as shown in FIG. 1, is shaped to securely hold a circuit board 4. The base 2 may be a PCB fixer or any other structure capable of securely holding the circuit board 4. In the shown embodiment, the base 2 is fixed. In another embodiment, the base 2 may be movable.

The movable unit 3, shown in FIG. 1, may be a motion system of any form known to those with ordinary skill in the art capable of accurately moving the heat-press unit 1; the movable unit 3 may, for example, be a two-dimensional motion system or a three-dimensional motion system including a 4-axis robot arm or a 6-axis robot arm.

The use of the pre-tin shaping system 1 will now be described in greater detail.

Figure 2:
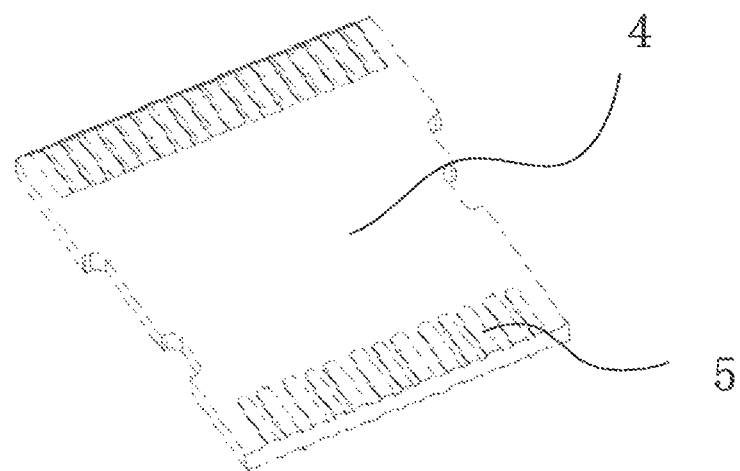
FIG. 2 is a perspective view of a circuit board before using the pre-tin shaping system of FIG. 1.
Figure 3:
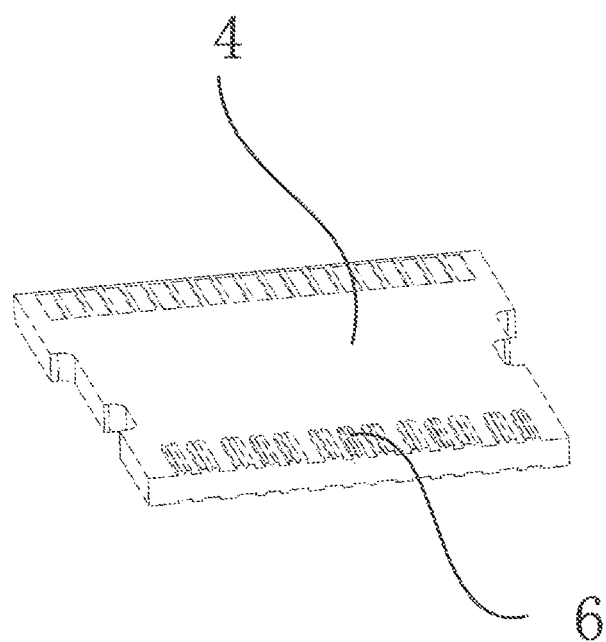
FIG. 3 is a perspective view of the circuit board after using the pre-tin shaping system of FIG. 1.

The circuit board 4 held in the base 2, as shown in FIGS. 2, 4, and 5, has a plurality of flat pre-tin layers 5 each disposed on a pad 7 of the circuit board 4. The heat-press unit 1 is moved by the movable unit 3 to position the contact tip 10 relative to the circuit board 4. The movable unit 3 moves the contact tip 10 to contact a pre-tin layer 5 as shown in FIGS. 4 and 5. The pre-tin layer 5 is melted by the shaped heater 12 at a temperature at which the pre-tin will be molten, and is pressed into a shaped pre-tin 6 shown in FIGS. 3 and 5 having a shape corresponding to the shaped heater 12. Meanwhile, the pair of supports 11 abut the circuit board 4 at each side of the pad 7 on which the shaped pre-tin 6 is disposed so as to inhibit molten pre-tin from flowing towards adjacent pads 7. The shape of the shaped pre-tin 6 is predetermined to facilitate a soldering connection between an electrical contact and the shaped pre-tin 6.

The contact tip 10, including the pair of supports 11 and the shaped heater 12, is made of a material that does not adhere to the pre-tin in the pre-tin layer 5 and the shaped pre-tin 6, for example, molybdenum alloy or titanium alloy.

In the shown embodiment, the heat-press unit 1 has one contact tip 10 which is moved by the movable unit 3 so as to heat and press the pre-tin layers 5 on the pads 7 one by one, forming the shaped pre-tin 6 one by one. In a further embodiment, the heat-press unit 1 may have more than one contact tip 10 arranged in parallel so as to simultaneously heat and press a plurality of pre-tin layers 5.

The pre-tin shaping system may further comprise a temperature control unit configured to control a heating temperature of the heat-press unit 1. For example, by means of closed-loop feedback control, the temperature control unit may heat the shaped heater 12 to different predetermined temperatures under which the pre-tin layer 5 is melted according to different compositions of the pre-tin layer 5. The temperature control unit may be any form of temperature control device known in the art and may be part of the heat-press unit 1 or may be provided separately.

A method for shaping pre-tin using the above-described pre-tin shaping system will now be described in greater detail.

The pre-tin shaping method comprises the steps of: securely holding the circuit board 4 by the base 2; moving the heat-press unit 1 relative to the base 2 by the movable unit 3 so as to align the contact tip 10 with the pre-tin layer 5 on the pad 7 of the circuit board 4; and heating and pressing the pre-tin layer 5 on the pad 7 by the heat-press unit 1 so as to form the shaped pre-tin 6.

When the contact tip 10 heats and presses the pre-tin layer 5, the pre-tin layer 5 is melted by the shaped heater 12 and then is shaped into a section shape corresponding to the shape of the shaped heater 12. The pair of supports 11 contact the circuit board at each side of the pad 7 to inhibit molten pre-tin from flowing towards adjacent pads 7. Subsequently, the contact tip 10 is lifted away from the pre-tin layer 5 by the movable unit 3, and the pre-tin is cooled to form the shaped pre-tin 6. As a result, the position of an electrical contact contacting the pad 7 of the circuit board 4 is precisely controlled, which facilitates the soldering connection between the electrical contact and the shaped pre-tin 6.

If the heat-press unit 1 has one contact tip 10, the contact tip 10 is moved by the movable unit 3 to heat and press the pre-tin layers 5 one by one, and the shaped pre-tins 6 are formed one by one. However, if the heat-press unit 1 has a plurality of contact tips 10, a plurality of pre-tin layers 5 are simultaneously heated and pressed.

The pre-tin shaping method may further include, by means of the closed-loop feedback control of the temperature control unit, adjusting the temperature of the shaped heater 12 to different predetermined temperatures under which the pre-tin is melted according to different compositions of the pre-tin.

The pre-tin shaping method may further include the step of moving the base 2 relative to the movable unit 3.

Advantageously, in the pre-tin shaping system and method according to the invention, shaping the pre-tin from the flat pre-tin layer 5 to the shaped pre-tin 6 permits precise control of a position of the electrical contact to be soldered to the shaped pre-tin 6 on the pad 7. The precise control of the electrical contact position reduces a risk of a dry or otherwise faulty soldering connection, thereby improving electrical connectivity between the electrical contact and the circuit board 4.

What is claimed is:

1. A pre-tin shaping system, comprising:
a base securely holding a circuit board having a pre-tin layer;
a heat-press unit having a contact tip; and
a movable unit moving the heat-press unit relative to the base, the contact tip movable to shape the pre-tin layer to correspond to a shape of the contact tip, only the pre-tin layer is disposed between the circuit board and the contact tip when the contact tip shapes the pre-tin layer.

2. The pre-tin shaping system of claim 1, wherein the pre-tin layer is disposed on a pad of the circuit board.

3. The pre-tin shaping system of claim 2, wherein the contact tip heats and presses the pre-tin layer into a shaped pre-tin.

4. The pre-tin shaping system of claim 3, wherein the contact tip has a pair of supports and a shaped heater disposed between the pair of supports.

5. The pre-tin shaping system of claim 4, wherein the shaped heater heats and presses the pre-tin layer.

6. The pre-tin shaping system of claim 5, wherein the pair of supports abut the circuit board at each side of the pad.

7. The pre-tin shaping system of claim 6, wherein the supports inhibit a molten pre-tin of the pre-tin layer from flowing toward an adjacent pad of the circuit board.

8. The pre-tin shaping system of claim 5, wherein the shaped heater is U-shaped or V-shaped.

9. The pre-tin shaping system of claim 5, wherein the shaped heater is formed of a material that is not adhesive to pre-tin.

10. The pre-tin shaping system of claim 9, wherein the shaped heater is formed of molybdenum alloy or titanium alloy.

11. The pre-tin shaping system of claim 5, further comprising a temperature control unit controlling a temperature of the shaped heater.

12. The pre-tin shaping system of claim 1, wherein the circuit board has a plurality of pre-tin layers.

13. The pre-tin shaping system of claim 12, wherein the heat-press unit has a plurality of contact tips.

14. The pre-tin shaping system of claim 1, wherein the base is movable.

* * * * *